(12) United States Patent
Krolak et al.

(10) Patent No.: US 8,825,417 B1
(45) Date of Patent: Sep. 2, 2014

(54) BATTERY HEALTH MANAGEMENT AND RECORDING

(75) Inventors: Matthew Joseph Krolak, Seattle, WA (US); John Anthony Trela, Seattle, WA (US)

(73) Assignee: The Boeing Company, Chicago, IL (US)

( * ) Notice: Subject to any disclaimer, the term of this patent is extended or adjusted under 35 U.S.C. 154(b) by 1189 days.

(21) Appl. No.: 12/549,677

(22) Filed: Aug. 28, 2009

(51) Int. Cl.
*G01R 31/36* (2006.01)

(52) U.S. Cl.
USPC ............................................ 702/63; 320/134

(58) Field of Classification Search
USPC ............................................ 702/63; 320/134
See application file for complete search history.

(56) References Cited

U.S. PATENT DOCUMENTS

| | | | |
|---|---|---|---|
| 7,349,816 B2 | 3/2008 | Quint et al. | |
| 7,474,228 B2 | 1/2009 | Lockhart et al. | |
| 7,554,294 B2 | 6/2009 | Srinivasan et al. | |
| 2005/0017685 A1* | 1/2005 | Rees et al. | 320/132 |
| 2006/0017582 A1* | 1/2006 | Lockhart et al. | 340/636.1 |
| 2008/0306637 A1 | 12/2008 | Borumand et al. | |

OTHER PUBLICATIONS

"Aircraft Battery State of Health Monitoring System—Command: NAVAIR, Topic N04-259", Venable Industries, pp. 1-5 retrieved Aug. 26, 2009 http:www.virtualacquisitionshowcase.com/docs/2008/Venable-Brief.pdf.

* cited by examiner

*Primary Examiner* — Jonathan C Teixeira Moffat
*Assistant Examiner* — Hien Vo
(74) *Attorney, Agent, or Firm* — Yee & Associates, P.C.

(57) ABSTRACT

A method, system, and apparatus are provided for managing battery data. A health monitoring unit monitors a number of battery units for battery data. A data logger stores the battery data. A data processing system identifies performance information from the battery data. A new battery design may be modified based on the performance data. Also, the performance data may be compared to health thresholds for inconsistencies to identify when the number of battery units may need to be serviced.

16 Claims, 5 Drawing Sheets

BATTERY HEALTH MANAGEMENT AND RECORDING

BACKGROUND INFORMATION

1. Field

The present disclosure relates generally to aircraft, and in particular, to management of battery systems in an aircraft. Still, more particularly, the present disclosure relates to a method and apparatus for monitoring a battery and storing the battery data.

2. Background

There are significant cost and maintenance challenges associated with batteries. These challenges may impose economic concerns in a wide variety of applications. For example, in the aerospace industry, aircraft use batteries in many systems. One use involves batteries being used as backups for systems in an aircraft. Batteries may provide emergency power in case a main power supply cannot provide the needed power. As another example, batteries may be used to start up a system in an aircraft, such as, an auxiliary power unit (APU).

Operations of an aircraft may be affected when a battery is unexpectedly unable to provide the needed power. For example, lost revenue may occur if the aircraft is pulled out of service to unscheduled maintenance for a battery that does not perform as expected. Flight delays and cancellations may occur. When aircraft are out of service for unscheduled maintenance, revenues from the aircraft are not realized. Also, associated costs and logistical challenges may occur.

Existing battery systems for aircraft and other aerospace systems typically provide only a limited indication of remaining battery capacity. The indication is often based solely on battery terminal voltage. Despite such existing voltage monitoring systems, battery systems still unexpectedly are unable to provide power at the needed levels for normal operation of the aircraft. A current solution to batteries wearing out is to have a replacement schedule. During the scheduled maintenance period a battery is tested to determine if it needs to be replaced. In some cases, individual battery cells are replaced. If the battery fails before the maintenance period, then the battery is replaced.

Additionally, sometimes the scheduled replacement period is based on the specifications of the battery. However, the specifications of the battery may be incorrect due to varying conditions such as type of usage, climate, and frequency of use.

Thus, it would be advantageous to have a method and apparatus that takes into account at least some of the issues discussed above, as well as possibly other issues.

SUMMARY

In an advantageous embodiment of the present disclosure, a process is provided for managing a battery system. The method comprises monitoring a number of battery units in the battery system for battery data. The battery data is stored. Then, performance information is identified for the number of battery units in the battery system using the battery data.

In another advantageous embodiment, a battery system is provided. The battery system comprises a number of battery units in the battery system and a health monitoring unit associated with the number of battery units and configured to monitor the number of battery units.

In still another advantageous embodiment, an apparatus is provided. The apparatus comprises a vehicle, a battery system to supply power to the vehicle, a number of battery packs in the battery system, and a health monitoring unit associated with the number of battery packs, including a data logger configured to store battery data.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
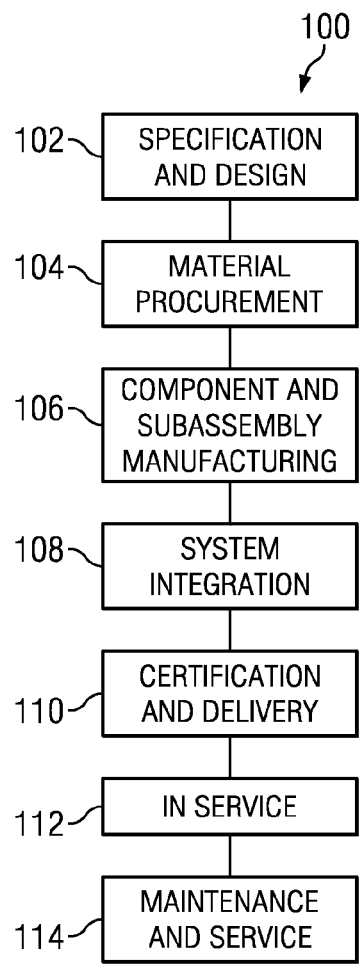
FIG. 1 is an illustration of an aircraft manufacturing and service method in which an advantageous embodiment may be implemented.
Figure 2:
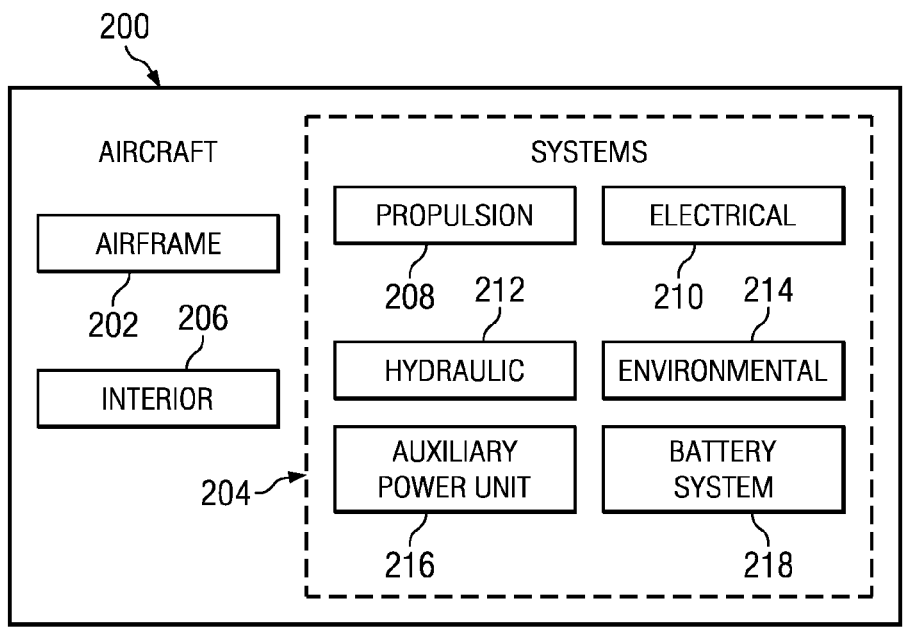
FIG. 2 is an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, illustrative aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with systems 204 and interior 206. Examples of systems 204 include one or more of propulsion system 208, electrical system 210, hydraulic system 212, environmental system 214, auxiliary power unit 216, and battery system 218. Any number of other systems may be included. Although an aerospace example is shown, different advantageous embodiments may be applied to other industries, such as the automotive industry.

Apparatus and methods embodied herein may be employed during at least one of the stages of aircraft manufacturing and service method 100 in FIG. 1. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of apparatus embodiments, method embodiments, or a combination thereof may be utilized during production stages, such as component and subassembly manufacturing 106 and system integration 108 in FIG. 1. A number, when referring to items means, one or more items. For example, a number of apparatus embodiments is one or more apparatus embodiments. A number of apparatus embodiments, method embodiments, or a combination thereof may be utilized while aircraft 200 is in service 112 and/or during maintenance and service 114 in FIG. 1. The use of a number of the different advantageous embodiments may substantially expedite the assembly of and/or reduce the cost of aircraft 200.

The different advantageous embodiments recognize and take into account a number of considerations. For example, the different advantageous embodiments recognize and take into account that currently batteries are replaced on a replacement schedule. The replacement schedule does not allow full use of the battery as they are replaced sometimes with useable life remaining.

The different advantageous embodiments also recognize and take into account a number of considerations. For example, the different advantageous embodiments recognize and take into account that current indicators of battery life may not be fully correct. Sometimes, various conditions of operation for batteries may cause the batteries to deviate from the indicated battery life.

The different advantageous embodiments also recognize and take into account a number of considerations. For example, the different advantageous embodiments recognize and take into account that conditions during the life of a battery which cause the battery to exhibit certain properties are unknown.

In an advantageous embodiment of the present disclosure, a process is provided for managing a battery system. The method comprises monitoring a number of battery units in the battery system for battery data. The battery data is stored. Then, performance information is identified for the number of battery units in the battery system using the battery data.

In another advantageous embodiment, a battery system comprises a number of battery units in the battery system and a health monitoring unit. The health monitoring unit is associated with the number of battery units and is configured to monitor the number of battery units.

In still another advantageous embodiment, an apparatus comprises a vehicle, a battery system, a number of battery packs in the battery system, and a health monitoring unit. The battery system is configured to supply power to the vehicle. The health monitoring unit is associated with the number of battery packs and has a data logger configured to store battery data.

Figure 3:
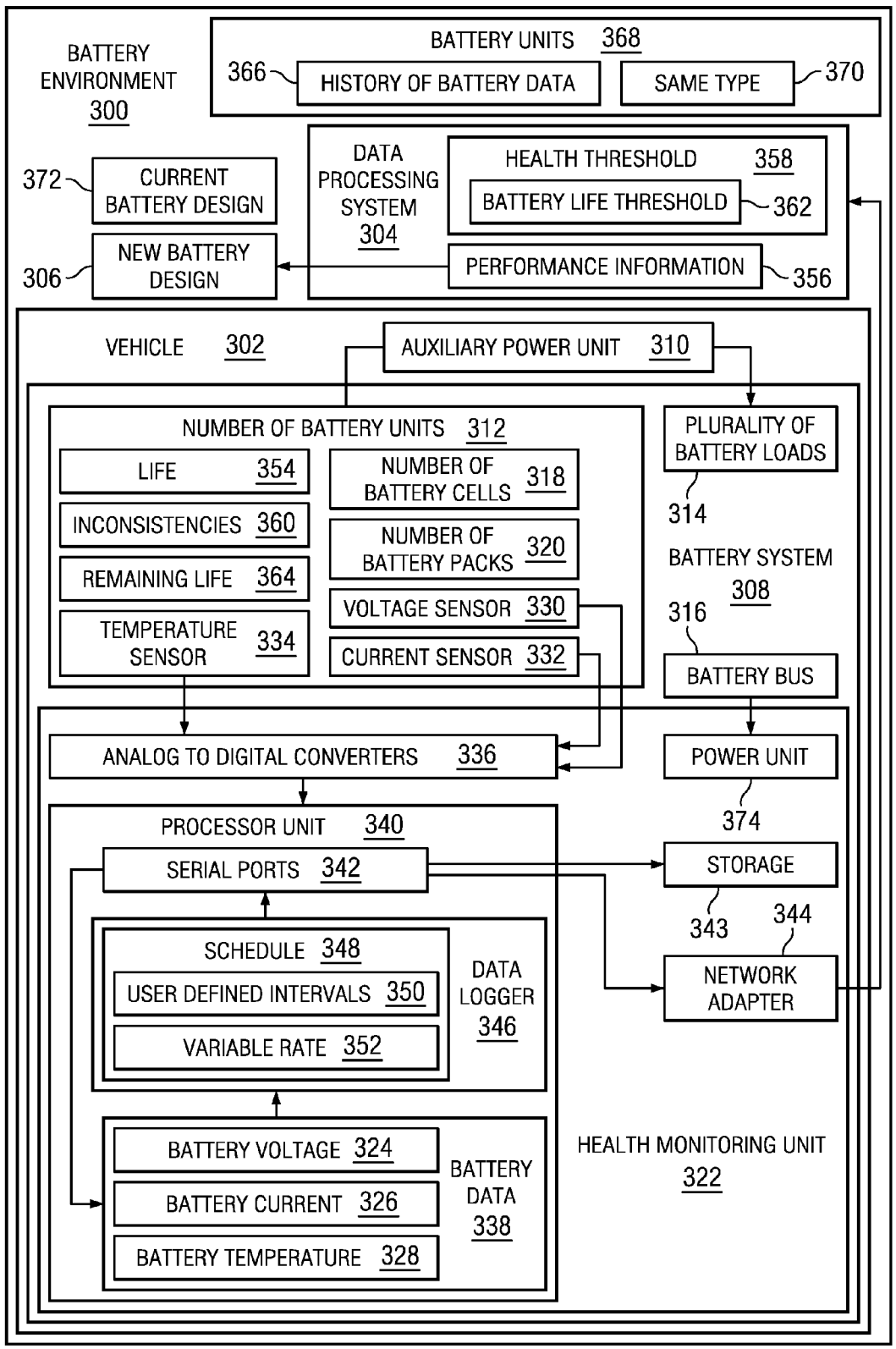
FIG. 3 is an illustration of a block diagram of a battery environment in accordance with an advantageous embodiment.

With reference to FIG. 3, a block diagram of a battery environment is depicted in accordance with an advantageous embodiment. Battery environment 300 comprises vehicle 302, data processing system 304, and new battery design 306. Vehicle 302 may be, for example, without limitation, an aircraft, an unmanned aerial vehicle (UAV), an electric or hybrid automobile, a golf cart or personal conveyance, or any other suitable type of vehicle having a battery system, such as battery system 308.

Vehicle 302 includes battery system 308 and auxiliary power unit 310. In these examples, auxiliary power unit 310 may provide power to plurality of battery loads 314. Battery system 308 is an example of a battery system that can be used to implement battery system 218 of FIG. 2.

Battery system 308 comprises number of battery units 312. Number of battery units 312 may comprise number of battery cells 318 and/or number of battery packs 320. A battery cell may be a single cell that furnishes electric current. A battery pack may comprise a number of battery cells. A battery pack or a battery cell may also be referred to as a "battery". In one or more illustrative embodiments, a number of battery cells may comprise a module and a number of modules may comprise a battery pack. As used herein, a number of items means one or more items.

Additionally, battery system 308 comprises health monitoring unit 322 associated with number of battery units 312 through battery bus 316. Health monitoring unit 322 monitors different properties of number of battery units 312. Health monitoring unit monitors at least one of battery voltage 324, battery current 326, and battery temperature 328. Health monitoring unit 322 monitors battery voltage 324 of number of battery units 312 through voltage sensor 330. Voltage sensor 330 may comprise a multimeter, voltmeter, oscilloscope, or analog to digital converter. Health monitoring unit 322 monitors battery current 326 of number of battery units 312 through current sensor 332. Current sensor 332 may comprise a multimeter, ammeter, clamp meter, galvanometer, hall-effect sensor, or analog to digital converter. Health monitoring unit 322 monitors battery temperature 328 of number of battery units 312 through temperature sensor 334. Battery temperature 328 may be measured inside or outside the battery or in different places on the battery. In different embodiments, health monitoring unit 322 may monitor other properties. For example, health monitoring unit 322 may monitor for structural integrity or battery impedance. The battery impedance may be derived from battery current 326 and battery voltage 324.

Analog to digital converters 336 takes battery data 338 in analog form from the different sensors and converts battery data 338 to a digital output and then sends the digital output to processor unit 340. Processor unit 340 may be a processor, a microcontroller, a plurality of processors, a multi-core processor and/or a microprocessor. Processor unit 340 receives battery data 338 from analog to digital converters 336 through serial ports 342. Battery data 338 comprises battery current 326, battery voltage 324, and battery temperature 328. Serial ports 342 may be serial peripheral interfaces. Process unit 340 also uses serial ports 342 to send battery data to storage 343 and data processing system 304 through network adapter 344. In different embodiments, other types of busses may be used, such as, but not limited to a parallel bus, an inter-integrated circuit bus, a controller-area network bus, or any other type of bus.

Battery data 338 is sent from serial ports 342 to data logger 346. Data logger 346 may be program code executed by processor unit 340 or in different embodiments; data logger 346 may be either hardwired in processor unit 340 or a separate processor unit. Data logger 346 records the history of battery data 338 over time. The frequency that data logger 346 requests battery data 338 is set using schedule 348. Schedule 348 may be user definable in user defined intervals 350. User defined intervals 350 may include, but are not limited to, once a second, minute, day, and/or month. User defined intervals 350 may be as continuous as possible given electronics available. For example, user defined intervals 350 may request battery data 350 one hundred and twenty times per second. In another illustrative embodiment, schedule 348 may be varied by data logger 346. Data logger 346 is configured to request and store battery data 338 at variable rate 352 in order to reduce storage requirements for periods of inactivity of battery conditions. For example, if there are not any changes to the battery conditions for five hours, instead of storing every five minutes, data logger 346 may stop storing after the last change in conditions or soon thereafter. In the example, data logger 346 may begin storing battery data 338 when activity starts again.

Data logger 342 may request battery data over life 354 of number of battery units 312. In different embodiments, life 354 of number of battery units 312 may be the life of a single battery in number of battery units 312, all of the batteries in number of battery units 312, or a combination of batteries in number of battery units 312. Life 354 may be the use of the battery during a usable life of the battery. The usable life of the battery is the duration in which the battery is still capable of meeting the system requirements. The system requirements may vary, but may require different attributes of the battery for example, a remaining charge of the battery. Life 354 may end with removal of a battery from battery system 308. Servicing of the battery in battery system 308 may not designate the end of life 354.

Data logger 342 timestamps battery data 338 and stores battery data 338 in storage 343. Storage 343 may be any type of memory or storage. For example, storage 343 may be a secure digital memory card, random access memory, a hard disk drive, optical disk, such as a CD or DVD, portable flash memory universal serial bus drive, or any other type of storage.

In different advantageous embodiments, data is also stored using network adapter 344 in addition to, or instead of, using storage 343.

Network adapter 344 allows processor unit 340 to connect to other data processing systems, such as data processing system 304. Network adapter 344 may be a wired and/or wireless network adapter.

A maintenance user may connect to network adapter 344 during, or in between, usages to modify settings and/or download battery data 338. In different embodiments, network adapter 344 may be connected to a central transmitter unit on vehicle 302 that collects all the data in vehicle 302 and transmits the data to a base station. In different embodiments, a maintenance user may remove a removable storage unit from storage 343 to retrieve battery data 338.

Data processing system 304 identifies performance information 356 using battery data 338. In different embodiments, processor unit 340 identifies performance information 356. Performance information 356 may be compared to health threshold 358 to determine whether inconsistencies 360 exist. Inconsistencies 360 are inconsistencies with at least one battery unit in number of battery units 312. For example, inconsistencies 360 may include a low capacity in the term of ampere-hours.

Health threshold 358 is a threshold designed to indicate that the health of at least one battery of number of battery units 312 has deteriorated to where the at least one battery may need to be serviced. During servicing, number of battery units 312 is tested to determine if any battery unit needs to be replaced, in some cases individual battery cells are replaced or individual battery packs are replaced. For example, health threshold 358 may be battery life threshold 362. Performance information 356 may include remaining life 364 of at least one battery in number of battery units 312. If remaining life 364 is lower than battery life threshold 362, then at least one battery of the number of battery units 312 may need to be replaced.

Performance information 356 may be the performance of number of battery units 312 during certain vehicle conditions. For example, while performance information 356 may indicate that number of battery units 312 spiked during startup of vehicle 302 which may indicate that number of battery units 312 has inconsistencies 360.

Performance information 356 may include battery voltage 324, battery current 326, battery temperature 328, the state of charge (SOC), state of life (SOL), and state of health (SOH) of number of battery units 312. At a given time, a battery has a maximum energy storage potential. The maximum energy storage potential may change over time. State of charge is the available capacity of the battery expressed as a percentage of its rated capacity.

State of charge is a comparison between the amount of energy stored in the battery against the maximum amount of energy which the battery is currently able to store. State of life is the remaining life of the battery, such as remaining life 364. State of life is used to estimate the number of remaining charge/discharge cycles for the battery. State of health is the health of the battery system by detecting, predicting and isolating different inconsistencies 360. State of health is the comparison of the current maximum storage potential against this value when the battery was new.

Performance information 356 may be identified for number of battery units 312 in battery system 308 using battery data 338 and history of battery data 366 for battery units 368 of a same type 370 as number of battery units 312.

Performance information 356 may be used during new battery design 306. Performance information 356 may be used to change the battery cell design for higher or lower temperature performance, add electrical protections, change the chemistry of battery units 312, and/or change charge voltage set-points of number of battery units 312, or any other design change that may occur. Performance information 356 may indicate that batteries used during certain conditions may have a longer life or shorter life than usually indicated. For example, performance information 356 may indicate that batteries used in Alaska last about 10 percent less than the indicated battery life.

Being able to know specific battery lives during specific conditions allows the manufacturer and/or seller of a battery to more reliably indicate battery life to a buyer. Modifying current battery design 372 for the battery system may be based on performance information 356 to form new battery design 306 for battery system 308.

Performance information 356 over life 354 of number of battery units 312 allows for an evaluation of what activities result in draining a battery. For example, performance information 356 over life 354 may indicate that a light was left on in vehicle 302 overnight. In different embodiments, health monitoring unit 322 may indicate that lights were left on. In different embodiments, health monitoring unit 322 may be combined with disconnects to shut off the lights if a health threshold were violated or an inconsistency was identified.

A cockpit may get a signal that is only a good or bad signal. If the signal is bad, the battery must be replaced. However, it is recognized that in different embodiments, health monitoring unit 322 may give the state of life or state of health and indicate that remaining life on the battery is present.

Power unit 374 receives power from number of battery units 312 and provides the power to health monitoring unit 322.

Comparing remaining life 364 of number of battery units 312 to health threshold 358 to service number of battery units 312 when needed instead of through a replacement schedule saves costs and increases the use of number of battery units 312. Servicing and replacement, if necessary, may occur at any level of number of battery units 312. Servicing may occur to one or more battery cells, one or more battery modules, or one or more battery packs.

The illustration of battery environment 300 in FIG. 3 is not meant to imply physical or architectural limitations to the manner in which different advantageous embodiments may be implemented. Other components in addition to, and/or in place of, the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, health monitoring unit 322 may be located on or off of battery system 308. Also, for example, performance information 356 and health threshold 358 may be located on processor unit 340 and calculations done by processing unit 340 instead of data processing system 304.

Figure 4:
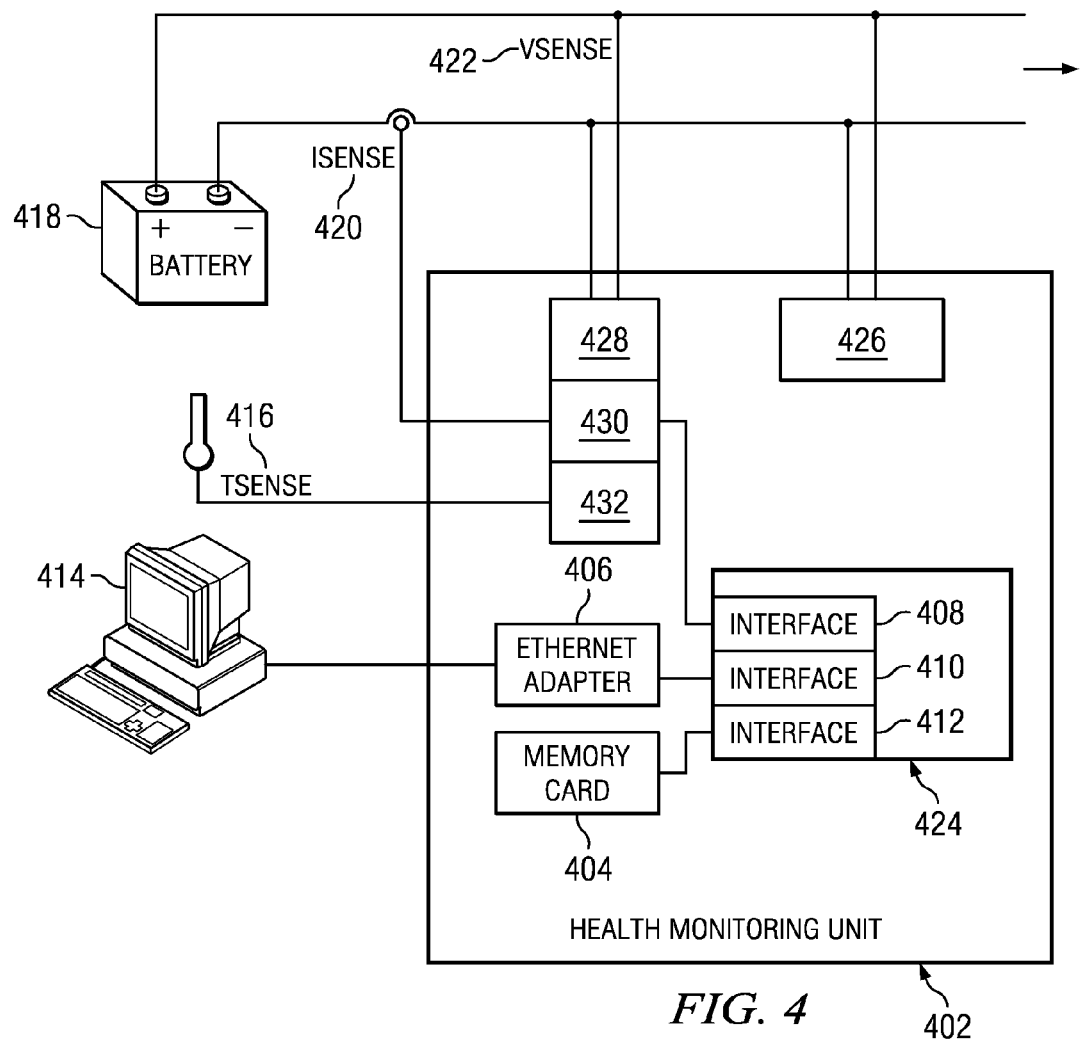
FIG. 4 is an illustration of a diagram of a battery system in accordance with an advantageous embodiment.

With reference to FIG. 4, a diagram of a battery system is depicted in accordance with an advantageous embodiment. Health monitoring Unit 402 is one example of one implementation of health monitoring unit 214 of FIG. 2.

Health monitoring Unit 402 comprises processor unit 424, power unit 426, analog to digital converters 428, 430, and 432, Ethernet adapter 406, and memory card 404. Processor unit 424 may be one example of processor unit 328 of FIG. 3. Power unit 426 may be one example of power unit 316 of FIG. 3. Analog to digital converters 428, 430, and 432 may be one example of analog to digital converters 336 of FIG. 3. Ethernet adapter 406 may be one example of an implementation for network adapter 334 of FIG. 3. Memory card 404 may be one example of storage 343 of FIG. 3.

Health monitoring Unit 402 takes temperature data of battery 418 with temperature sensor 416. Temperature sensor 416 is one example of temperature sensor 334 of FIG. 3. Health monitoring Unit 402 takes voltage data of battery 418 with voltage sensor 422. Voltage sensor 422 is one example of voltage sensor 330 of FIG. 3. Health monitoring Unit 402 takes current data of battery 418 with current sensor 420. Current sensor 420 is one example of current sensor 332 of FIG. 3.

Health monitoring Unit 402 transmits information to data processing system 414 through Ethernet adapter 406. Ethernet adapter 406 may be a wired or wireless connection. Data processing system 414 is one example of data processing system 304 of FIG. 3. In different advantageous embodiments, other types of communication protocols may be used, such as, but not limited to, Bluetooth®, ZigBee®, or any other type of communications protocol.

Processor unit 424 communicates with analog to digital converters 428, 430, and 432, Ethernet adapter 406, and memory card 404 through interfaces 408, 410, and 412. Interfaces 408, 410, and 412 may be serial peripheral interfaces. Interfaces 408, 410, and 412 may be one example of serial ports 342 of FIG. 3.

Figure 5:
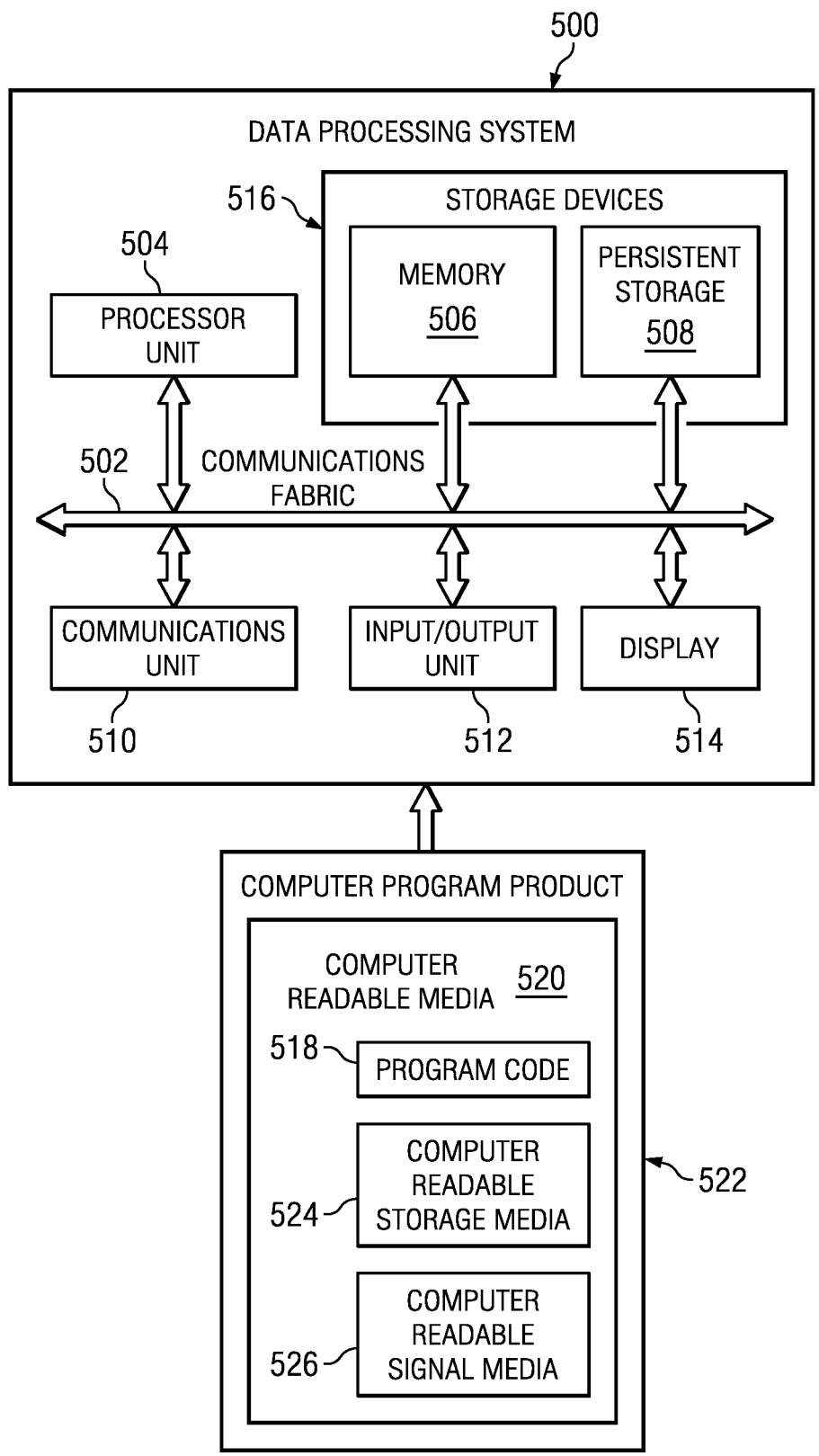
FIG. 5 is an illustration of a block diagram of a data processing system in accordance with an advantageous embodiment.

Turning now to FIG. 5, a diagram of a data processing system is depicted in accordance with an advantageous embodiment. Data processing system 500 is an example of one manner in which data processing system 304 in FIG. 3 may be implemented. Data processing system 500 is also an example of one manner in which data processing system 414 in FIG. 4 may be implemented.

In this advantageous example, data processing system 500 includes communications fabric 502, which provides communications between processor unit 504, memory 506, persistent storage 508, communications unit 510, input/output (I/O) unit 512, and display 514.

Processor unit 504 serves to execute instructions for software that may be loaded into memory 506. Processor unit 504 may be a set of one or more processors or may be a multi-processor core, depending on the particular implementation. Further, processor unit 504 may be implemented using one or more heterogeneous processor systems, in which a main processor is present with secondary processors on a single chip. As another advantageous example, processor unit 504 may be a symmetric multi-processor system containing multiple processors of the same type.

Memory 506 and persistent storage 508 are examples of storage devices 516. A storage device is any piece of hardware that is capable of storing information, such as, for example, without limitation, data, program code in functional form, and/or other suitable information either on a temporary basis and/or a permanent basis. Memory 506, in these examples, may be, for example, a random access memory, or any other suitable volatile or non-volatile storage device. Persistent storage 508 may take various forms, depending on the particular implementation. For example, persistent storage 508 may contain one or more components or devices. For example, persistent storage 508 may be a hard drive, a flash memory, a rewritable optical disk, a rewritable magnetic tape, or some combination of the above. The media used by persistent storage 508 may be removable. For example, a removable hard drive may be used for persistent storage 508.

Communications unit 510, in these examples, provides for communication with other data processing systems or devices. In these examples, communications unit 510 is a network interface card. Communications unit 510 may provide communications through the use of either or both physical and wireless communications links.

Input/output unit 512 allows for the input and output of data with other devices that may be connected to data processing system 500. For example, input/output unit 512 may provide a connection for user input through a keyboard, a mouse, and/or some other suitable input device. Further, input/output unit 512 may send output to a printer. Display 514 provides a mechanism to display information to a user.

Instructions for the operating system, applications, and/or programs may be located in storage devices 516, which are in communication with processor unit 504 through communications fabric 502. In these illustrative examples, the instructions are in a functional form on persistent storage 508. These instructions may be loaded into memory 506 for execution by processor unit 504. The processes of the different embodiments may be performed by processor unit 504 using computer implemented instructions, which may be located in a memory, such as memory 506.

These instructions are referred to as program code, computer usable program code, or computer readable program code that may be read and executed by a processor in processor unit 504. The program code, in the different embodiments, may be embodied on different physical or computer readable storage media, such as memory 506 or persistent storage 508.

Program code 518 is located in a functional form on computer readable media 520 that is selectively removable and may be loaded onto or transferred to data processing system 500 for execution by processor unit 504. Program code 518 and computer readable media 520 form computer program product 522. In one example, computer readable media 520 may be computer readable storage media 524 or computer readable signal media 526. Computer readable storage media 524 may include, for example, an optical or magnetic disc that is inserted or placed into a drive or other device that is part of persistent storage 508 for transfer onto a storage device, such as a hard drive, that is part of persistent storage 508. Computer readable storage media 524 also may take the form of a persistent storage, such as a hard drive, a thumb drive, or a flash memory that is connected to data processing system 500. In some instances, computer readable storage media 524 may not be removable from data processing system 500.

Alternatively, program code 518 may be transferred to data processing system 500 using computer readable signal media 526. Computer readable signal media 526 may be, for example, a propagated data signal containing program code 518. For example, computer readable signal media 526 may be an electro-magnetic signal, an optical signal, and/or any other suitable type of signal. These signals may be transmitted over communication links, such as wireless communication links, an optical fiber cable, a coaxial cable, a wire, and/or any other suitable type of communication link. In other words, the communication link and/or the connection may be physical or wireless in the illustrative examples.

In some illustrative embodiments, program code 518 may be downloaded over a network to persistent storage 508 from another device or data processing system through computer readable signal media 526 for use within data processing system 500. For instance, program code stored in a computer readable storage media in a server data processing system may be downloaded over a network from the server to data processing system 500. The data processing system providing program code 518 may be a server computer, a client computer, or some other device capable of storing and transmitting program code 518.

The different components illustrated for data processing system 500 are not meant to provide architectural limitations to the manner in which different embodiments may be implemented. The different advantageous embodiments may be implemented in a data processing system including components in addition to, or in place of, those illustrated for data processing system 500. Other components shown in FIG. 5 can be varied from the illustrative examples shown. The different embodiments may be implemented using any hardware device or system capable of executing program code. As one example, data processing system 500 may include organic components integrated with inorganic components and/or may be comprised entirely of organic components excluding a human being. For example, a storage device may be comprised of an organic semiconductor.

As another example, a storage device in data processing system 500 is any hardware apparatus that may store data. Memory 506, persistent storage 508, and computer readable media 520 are examples of storage devices in a tangible form.

In another example, a bus system may be used to implement communications fabric 502 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 506 or a cache such as found in an interface and memory controller hub that may be present in communications fabric 502.

Figure 6:
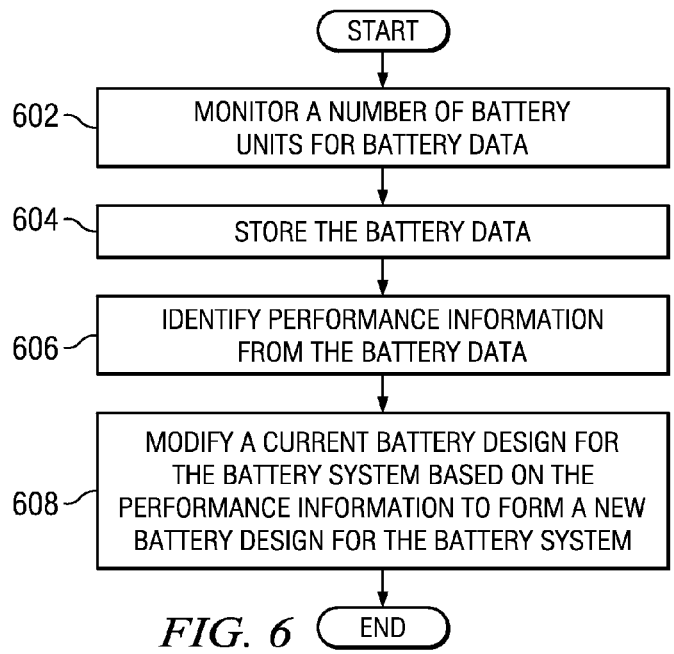
FIG. 6 is an illustration of a flowchart of a process for designing a new battery in accordance with an advantageous embodiment.

With reference to FIG. 6, a flowchart of a process for designing a new battery is depicted in accordance with an advantageous embodiment. This process may be implemented using battery system 300 in FIG. 3.

The process begins by monitoring a number of battery units for battery data (step 602). Monitoring a number of battery units for battery data further comprises monitoring at least one of a battery current, battery voltage, and a battery temperature. Then, the process stores the battery data (step 604). Storing the battery data may be performed by schedule. The schedule may be in user defined intervals or at a variable rate. The variable rate is storing the battery data when activity exists in the number of battery units. Storing the battery data may also be over a life of the number of battery units. The life may be the usable life of the number of batter units or a battery unit of the number of battery units. Next, the process identifies performance information from the battery data (step 606). The performance information comprises at least one of battery current, battery voltage, battery temperatures, battery life, battery charge, and battery health. Then, the process modifies a current battery design for the battery system based on the performance information to form a new battery design for the battery system (step 608). Thereafter, the process terminates.

Figure 7:
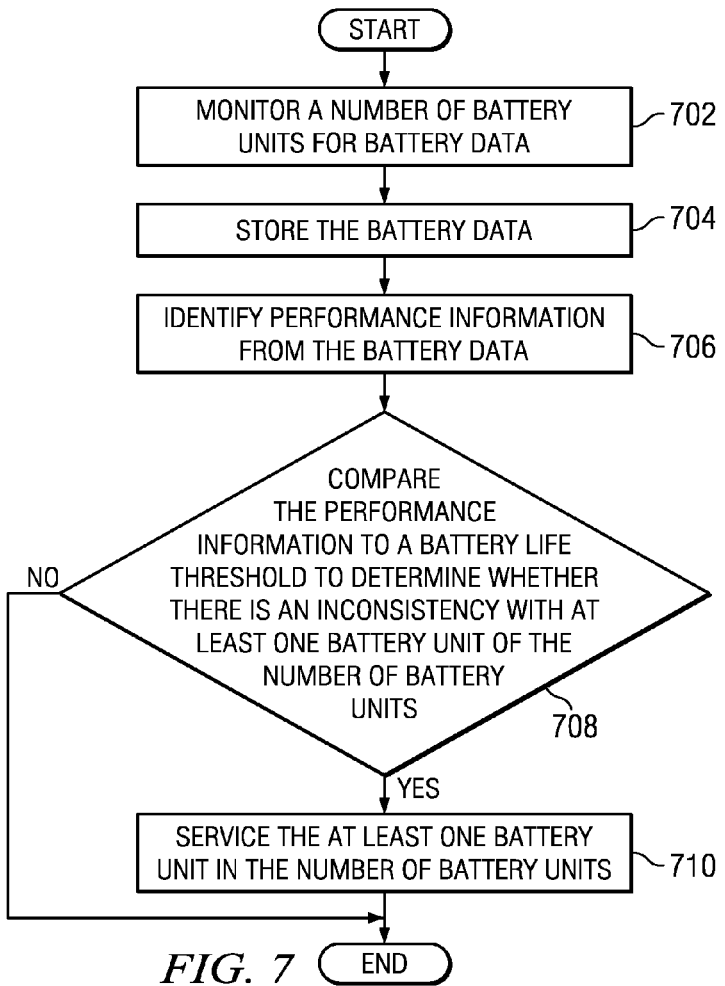
FIG. 7 is an illustration of a flowchart of a process for replacing a battery in accordance with an advantageous embodiment.

With reference to FIG. 7, a flowchart of a process for replacing a battery is depicted in accordance with an advantageous embodiment. This process may be implemented using battery system 300 in FIG. 3.

The process begins by monitoring a number of battery units for battery data (step 702). Monitoring a number of battery units for battery data further comprises monitoring at least one of a battery current, battery voltage, and a battery temperature. Then, the process stores the battery data (step 704). Storing the battery data may be performed by schedule. The schedule may be in user defined intervals or at a variable rate. The variable rate is storing the battery data when activity exists in the number of battery units. Storing the battery data may also be over a life of the number of battery units. The life may be the usable life of the number of batter units or a battery unit of the number of battery units.

Next, the process identifies performance information from the battery data (step 706). The performance information comprises at least one of a battery voltage, battery current, battery temperature, battery life, battery charge, and battery health. Then, the process compares the performance information to a health threshold to determine whether an inconsistency with at least one battery unit of the number of battery units is present (step 708).

If the inconsistency with at least one battery unit of the number of battery units is absent, the process terminates. If the inconsistency with at least one battery unit of the number of battery units is present, the process services the at least one battery unit in the number of battery units (step 710). During servicing, number of battery units is tested to determine if any battery unit needs to be replaced, in some cases individual battery cells are replaced or individual battery packs are replaced. For example, the health threshold may be a battery life threshold and the inconsistency may be the at least one battery unit having a battery life less than the battery life threshold. Thereafter, the process terminates.

The flowcharts and block diagrams in the different depicted embodiments illustrate the architecture, functionality, and operation of some possible implementations of apparatus and methods in different advantageous embodiments. In this regard, each block in the flowcharts or block diagrams may represent a module, segment, function, and/or a portion of an operation or step. In some alternative implementations, the function or functions noted in the blocks may occur out of the order noted in the figures. For example, in some cases, two blocks shown in succession may be executed substantially concurrently, or the blocks may sometimes be executed in the reverse order, depending upon the functionality involved.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for managing a battery system, the method comprising:
monitoring a number of battery units in the battery system for battery data, wherein the battery data comprises at least one of battery voltage, battery current, and battery temperature;
storing the battery data using a schedule, wherein the schedule is a variable rate, wherein the variable rate is configured to store the battery data when activity exists in the number of battery units, but temporarily postpones the storing of battery data if there have no changes to the battery data after a predetermined period of time;
identifying performance information for the number of battery units in the battery system using the battery data and a history of battery data for battery units of a same type as the number of battery units, the performance data comprising state of life, state of charge, and state of health.

2. The method of claim 1, further comprising:
modifying a current battery design for the battery system based on the performance information to form a new battery design for the battery system.

3. The method of claim 1, further comprising:
comparing the performance information to a health threshold to determine whether an inconsistency is present with at least one battery unit of the number of battery units in the battery system.

4. The method of claim 3, further comprising:
responsive to a determination that the inconsistency is present, servicing the at least one battery unit in the number of battery units.

5. The method of claim 4, wherein the step of servicing the at least one battery unit in the number of battery units further comprises:
testing the at least one battery unit in the number of battery units to determine whether the at least one battery unit in the number of battery units needs to be replaced.

6. The method of claim 1, wherein storing the battery data is over a life of the number of battery units.

7. The method of claim 1, wherein the step of identifying performance information further comprises identifying the performance information:
wherein the state of charge is a comparison between an amount of energy stored in the battery against a maximum amount of energy which the battery is currently able to store;
wherein the state of life is a remaining life of the battery, used to estimate a number of remaining charge/discharge cycles for the battery; and
wherein the state of health is a comparison of a current maximum storage potential against a maximum storage potential when the battery was new, determined by detecting, predicting and isolating different inconsistencies.

8. An apparatus, comprising:
a number of battery units in the battery system; and
a health monitoring unit associated with the number of battery units, the health monitoring unit configured to monitor the number of battery units in the battery system for battery data, wherein the battery data comprises at least one of battery voltage, battery current, and battery temperature for the number of battery units; store the battery data; identify performance information for the number of battery units in the battery system using the battery data and a history of battery data for battery units of a same type as the number of battery units, the performance data comprising state of life, state of charge, and state of health, wherein the health monitoring unit includes a data logger configured to store the battery data using a schedule, wherein the schedule is a variable rate, wherein the variable rate is the data logger being configured to store the battery data when activity exists in the number of battery units, but temporarily postpones the storing of battery data if there have no changes to the battery data after a predetermined period of time.

9. The apparatus of claim 8, further comprising:
a vehicle, the vehicle including the battery system, the number of battery units, and the health monitoring unit.

10. The apparatus of claim 8, wherein the health monitoring unit is configured to compare the performance information to a health threshold to determine whether an inconsistency with at least one battery unit of the number of battery units is present.

11. The apparatus of claim 8, wherein the health monitoring unit is configured to store the battery data over a life of the number of battery units.

12. The apparatus of claim 8, wherein the performance information further comprises:

wherein the state of charge is a comparison between an amount of energy stored in the battery against a maximum amount of energy which the battery is currently able to store;

wherein the state of life is a remaining life of the battery, used to estimate a number of remaining charge/discharge cycles for the battery; and wherein the state of health is a comparison of a current maximum storage potential against a maximum storage potential when the battery was new, determined by detecting, predicting and isolating different inconsistencies.

13. A battery environment, comprising:

a battery system for an aircraft, wherein the battery system is configured to supply power to the aircraft;

a number of battery packs located in the battery system;

a health monitoring unit configured to monitor the number of battery units in the battery system for battery data, wherein the battery data comprises at least one of battery voltage, battery current, and battery temperature for the number of battery units, the health monitoring unit associated with the number of battery packs and including a data logger configured to store the battery data, wherein the health monitoring unit includes a data logger configured to store the battery data using a schedule, wherein the schedule is a variable rate, wherein the variable rate is the data logger being configured to store the battery data when activity exists in the number of battery units, but temporarily postpones the storing of battery data if there have no changes to the battery data after a predetermined period of time; and a data processing system configured to identify performance information for the number of battery units in the battery system using the battery data and a history of battery data for battery units of a same type as the number of battery units, the performance data comprising state of life, state of charge, and state of health.

14. The battery environment of claim 13, wherein the data processing system is configured to compare the performance information to a health threshold to determine whether there is an inconsistency with at least one battery unit of the number of battery units.

15. The battery environment of claim 14, wherein the health monitoring unit is configured to service the at least one battery unit in the number of battery units in response to a determination that the inconsistency with at least one battery unit of the number of battery units is present, wherein the health threshold is a battery life threshold, and wherein the inconsistency is the at least one battery unit having a remaining life less than the battery life threshold.

16. The battery environment of claim 13, wherein the performance information further comprises:

wherein the state of charge is a comparison between an amount of energy stored in the battery against a maximum amount of energy which the battery is currently able to store;

wherein the state of life is a remaining life of the battery, used to estimate a number of remaining charge/discharge cycles for the battery; and wherein the state of health is a comparison of a current maximum storage potential against a maximum storage potential when the battery was new, determined by detecting, predicting and isolating different inconsistencies.

* * * * *